United States Patent
Gozen

(10) Patent No.: US 8,050,646 B2
(45) Date of Patent: Nov. 1, 2011

(54) NOISE SUPPRESSING DEVICE

(75) Inventor: Shinya Gozen, Hyogo (JP)

(73) Assignee: Panasonic Corporation, Osaka (JP)

( * ) Notice: Subject to any disclaimer, the term of this patent is extended or adjusted under 35 U.S.C. 154(b) by 598 days.

(21) Appl. No.: 12/294,314

(22) PCT Filed: Mar. 15, 2007

(86) PCT No.: PCT/JP2007/055266
§ 371 (c)(1),
(2), (4) Date: Sep. 24, 2008

(87) PCT Pub. No.: WO2007/122923
PCT Pub. Date: Nov. 1, 2007

(65) Prior Publication Data
US 2009/0274251 A1    Nov. 5, 2009

(30) Foreign Application Priority Data
Apr. 24, 2006   (JP) .................................. 2006-119560

(51) Int. Cl.
*H04B 1/10*   (2006.01)
(52) U.S. Cl. ................... 455/296; 455/63.11; 455/570; 455/222; 379/406.1; 379/406.5
(58) Field of Classification Search ................ 455/63.1, 455/570, 114.2, 296, 222; 379/406.01, 406.05
See application file for complete search history.

(56) References Cited

U.S. PATENT DOCUMENTS

| | | | |
|---|---|---|---|
| 7,366,491 B1 * | 4/2008 | Suzuki et al. | 455/296 |
| 2004/0190656 A1 * | 9/2004 | Taira | 375/346 |
| 2005/0058296 A1 * | 3/2005 | Karasudani | 381/13 |

FOREIGN PATENT DOCUMENTS

| | | |
|---|---|---|
| JP | 7-30448 | 1/1995 |
| JP | 8-163065 | 6/1996 |
| JP | 2000-101459 | 4/2000 |
| JP | 3213495 | 7/2001 |
| JP | 2004-363694 | 12/2004 |

OTHER PUBLICATIONS

International Search Report issued Jun. 5, 2007 in the International (PCT) Application of which the present application is the U.S. National Stage.

* cited by examiner

*Primary Examiner* — Tuan Pham
(74) *Attorney, Agent, or Firm* — Wenderoth, Lind & Ponack, L.L.P.

(57) ABSTRACT

To provide a noise suppressing device which accurately suppresses weak electric field strength pulse noise.

A band-limiting unit (5) band-limits a composite signal obtained by demodulating an FM baseband signal, to a frequency band equal to or lower than a predetermined frequency so as to output a monaural audio signal. A pulse detecting unit (62) which detects pulse noise in the audio signal outputted by the band-limiting unit (5). A pulse judging unit (63) judges that a detection result of the pulse detecting unit (62) is valid in the case where pulse noise is detected in the composite signal, at a position corresponding to the detected pulse noise. A pulse suppressing unit (64) suppresses the pulse noise detected in the audio signal, in the case where the pulse judging unit (63) judges that the detection result is valid. Specifically, the amplitude of the composite signal which is synchronized with the audio signal is compared with a threshold, and it is judged that the detection result is pulse noise in the case where the amplitude of the composite signal exceeds the threshold.

10 Claims, 11 Drawing Sheets

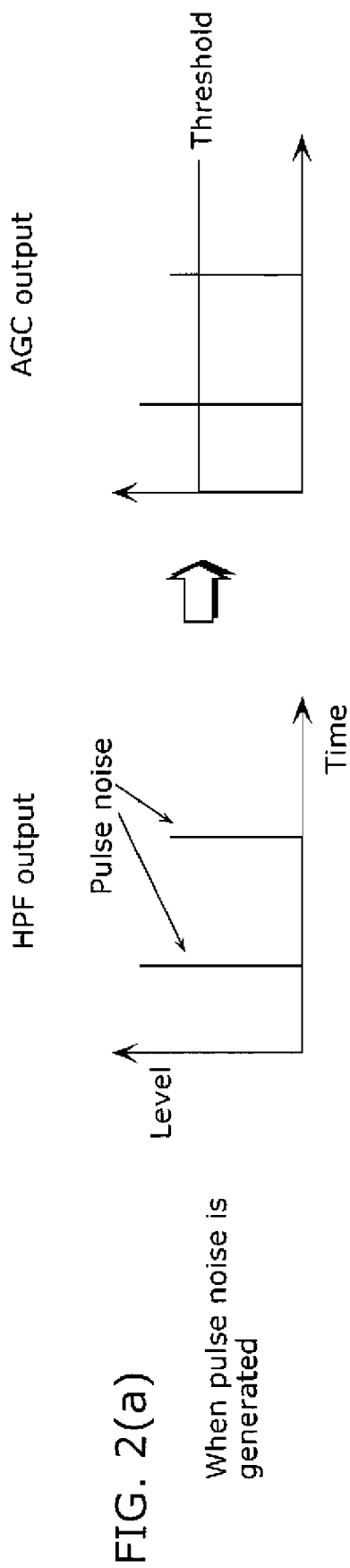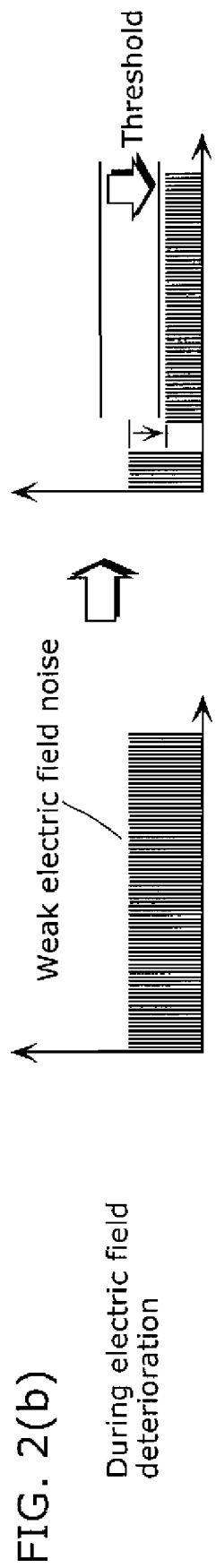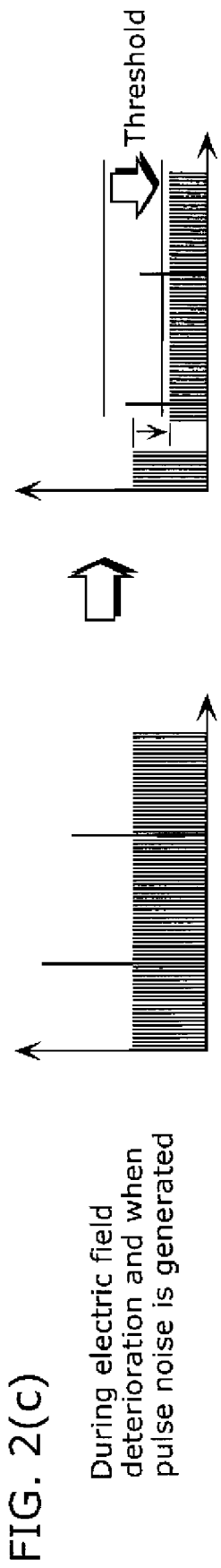
FIG. 2(a) When pulse noise is generated
FIG. 2(b) During electric field deterioration
FIG. 2(c) During electric field deterioration and when pulse noise is generated 15KHz 19KHz 15KHz 19KHz

NOISE SUPPRESSING DEVICE

TECHNICAL FIELD

The present invention relates to a noise suppressing device and a noise cancellation technique for performing noise suppression and noise cancellation in a frequency modulation (FM) radio receiver at low electric field strength.

BACKGROUND ART

In FM radio receivers, countermeasures are generally taken against various types of noise so as to improve sound quality. Particularly, in an in-vehicle radio receiver, there are instances where emergent pulse noise caused by engine revolution, wipers, or door mirrors, for example, become a problem, and noise cancellation techniques for removing such noise have been proposed and put into use.

Meanwhile, in the case of radio receivers, the level of background noise increases with the deterioration of the reception electric field. Although this noise is a white noise called weak-electric field noise, there is a problem that, during such time of electric field deterioration, a pulse noise canceller misoperates due to background noise. Consequently, a noise cancellation technique which includes an Automatic Gain Control (AGC) circuit and a noise detection circuit is proposed (see Patent Reference 1). FIG. 1, FIG. 2, and FIG. 3 show an outline of a conventional noise cancellation technique. FIG. 1 is a block diagram showing the configuration of a conventional noise canceller. FIG. 2(a) is a diagram showing the relationship of High-pass Filter (HPF) output and AGC output at the time when pulse noise is generated. FIG. 2(b) is a diagram showing the relationship of HPF output and AGC output at a time of electric field deterioration. FIG. 2(c) is a diagram showing the relationship of HPF output and AGC output at a time of electric field deterioration and when pulse noise is generated.

In FIG. 1, the conventional pulse noise canceller includes a delay device 100, a pulse detecting unit 200, and a pulse suppressing unit 300. An FM composite signal is inputted to the pulse detecting unit 200, and pulse noise is detected. At the same time, after the FM composite signal passes the delay device 100 for a detection delay amount, the pulse noise in the detection interval is removed by the pulse suppressing unit 300. The pulse detecting unit 200 is configured of a High-pass Filter (HPF) 201, an AGC circuit 202, and a comparator 203. The high-pass filter 201 passes only the high-frequency component of the FM composite signal. The AGC circuit 202 applies gain control depending on the output signal level of the high-pass filter 201. Specifically, as shown in FIG. 2(a), when the high-pass filter output is only pulse noise, the rectified signal level is low and thus AGC output gain remains high. In contrast, as shown in FIG. 2(b), when the background noise of the high-pass filter output increases, the rectified signal level becomes high and thus AGC output gain becomes low, and gain control is applied so as to suppress misdetection due to background noise. The pulse detection unit 200: compares the output level of the AGC circuit 202 and a predetermined threshold (the "second threshold" in the Claims); detects, as pulse noise, the case where the AGC output level exceeds the threshold; and controls the pulse suppressing unit 300. Here, as shown in FIG. 2(b), since even the pulse noise level is limited when gain control is performed by the AGC circuit 202 at a time of electric field deterioration, even pulse noise cannot be detected by using the initial threshold as-is. Consequently, as shown in FIG. 2(c), by controlling the threshold depending on the output gain of the AGC circuit 202, pulse noise can be detected without misdetection, even at the time of electric field deterioration. The pulse suppressing unit 300 can be implemented through an interpolation circuit that outputs an inputted signal as-is during a period in which a pulse is not detected and, during an interval in which a pulse is detected, holds the value immediately preceding the detection interval, for example.

Patent Reference 1: Japanese Patent No. 3213495

DISCLOSURE OF INVENTION

Problems that Invention is to Solve

However, when the reception electric field further deteriorates and becomes a weak electric field equal to or lower than a fixed level, pulse noise is also generated aside from white background noise. In a conventional analog radio receiver, pulse noise when the electric field is weak does not become a problem since, through the introduction of an IF amplifier and the like, it is possible to amplify the amplitude of the signal and increase reception electric field strength. In contrast, in a digital radio receiver, an IF amplifier is purposely not provided since processing corresponding to the electric field strength can be performed on a per sample basis, rather than performing amplitude control based on a long-time average of an input signal. As such, there is the problem that the impact of such pulse noise manifests itself noticeably, and removal of the pulse noise becomes necessary. In such a weak electric field state, background noise becomes dominant and thus detecting only pulse noise becomes extremely difficult, and there is a problem of the occurrence of misoperation such as the occurrence of sound distortion caused by misdetection. The reason for this is described hereafter using FIG. 3(a) and FIG. 3(b).

FIG. 3(a) is a diagram showing the frequency characteristics of an FM composite signal, a low-pass filter output, and pulse noise, when the electric field is strong. FIG. 3(b) is a diagram showing the frequency characteristics of an FM composite signal, a low-pass filter output, pulse noise, and background noise, when the electric field is weak. As shown in FIG. 3(a), the FM composite signal includes a (L+R) signal 901 for monaural broadcasting and an (L−R) signal 902 for stereo broadcasting. Whether a received FM signal is a monaural broadcast or a stereo broadcast is determined according to whether or not there is a 19 kHz pilot signal 905. Furthermore, since pulse noise 903 included in the received FM signal includes components from all frequency bands, it is possible to detect the pulse noise 903 by extracting a component of a frequency higher than the composite signal band, using a high-pass filter. On the other hand, as shown in FIG. 3(b), when the electric field is weak, background noise 906 increases. As a characteristic of an FM broadcast, the higher the frequency, the more the background noise 906 increases, and thus it becomes difficult to accurately detect the pulse noise 903 even when the component of a frequency higher than the component signal is extracted.

Consequently, in order to remove weak electric field pulse noise, detection and removal performed, not on the composite signal, but on the more narrowly band-limited monaural audio signal (that is, (L+R) signal 901) is effective. By band-limiting, it becomes possible to reduce the impact of the background noise 906, and facilitate the detection of the pulse noise 903. Since the (L+R) signal 901 of a band roughly equal to or lower than 15 kHz is to be extracted from the composite signal, a low-pass filter frequency characteristic 904 passes bands roughly equal to or lower than 20 kHz. Therefore, as shown in FIG. 3(a), when the electric field is strong, it is considered sufficient to detect the pulse noise 903 of a frequency which is higher than the (L+R) signal 901 and which passes through the low-pass filter, that is, a frequency between 15 kHz and 20 kHz.

However, in actuality, filters which can accurately extract only signals (pulse noise 903) between 15 kHz and 20 kHz are very expensive and therefore not practical. On the other hand, with a practical filter, it is difficult to distinguish between the pulse noise 903 and high-frequency components of music such as the sound of cymbals, or the sound of the letter "s" included in speech, included in a monaural audio signal. Therefore, there is the problem that, even when the conventional method is diverted for use, as-is, with the audio signal bands, misdetection of pulse noise is triggered, causing the occurrence of sound distortion in the output audio signal, due to the suppression of the misdetected pulse noise.

The present invention is conceived to solve the aforementioned problem and is aimed at removing weak electric field pulse noise generated due to deterioration of reception electric field, and has as an object to provide a noise suppressing device which can achieve a significant sound-quality improvement-effect without misoperation.

Means to Solve the Problems

In order to solve the aforementioned problem, the noise suppressing device according to the present invention is a noise suppressing device which suppresses pulse noise included in a frequency-modulated signal at low electric field strength, the noise suppressing device includes: a band-limiting unit which band-limits a composite signal to a band equal to or lower than a predetermined frequency so as to output an audio signal, the composite signal being obtained by demodulating an FM baseband signal; a pulse detecting unit which detects pulse noise in the audio signal outputted by the band-limiting unit; a pulse judging unit having the composite signal as an input, and which judges that a detection result of the pulse detecting unit is valid in the case where pulse noise is included in the composite signal at a position corresponding to the pulse noise detected in the audio signal; and a pulse suppressing unit which suppresses the pulse noise detected in the audio signal, in the case where the pulse judging unit judges that the detection result of the pulse detecting unit is valid.

It should be noted that the present invention can be implemented, not only as an apparatus, but also as: a method having, as steps, the processing units included in such apparatus; a program causing a computer to execute such steps; a computer-readable recording medium, such as a CD-ROM, on which a such program is recorded; and information, data, or a signal representing such program. Moreover, such program, information, data and signal may be distributed via a communication network such as the Internet.

Effects of the Invention

The present invention compares, with a predetermined threshold, the amplitude value of a composite signal sample which is synchronized with a detection interval of weak electric field pulse noise in an audio signal, and distinguishes between the pulse noise in the audio signal and a high-frequency component of the signal by judging that the audio signal within the detection interval is pulse noise, in the case where the amplitude of the composite signal within the detection interval exceeds the threshold. Accordingly, it is possible to remove weak electric field pulse noise without misoperation, and achieve a significant sound-quality improvement-effect. In addition, the present invention performs noise subtraction in the frequency domain, after removing the weak electric field pulse noise. Accordingly, it is possible to inhibit the rising of the level of the frequency spectrum of the audio signal including the pulse noise due to the spectrum of the pulse noise. Accordingly, there is the advantageous effect of enabling the removal of noise patterns corresponding to the electric field strengths, from the frequency spectrum of an audio signal, and the reproduction of an audio signal that is closer to the original sound.

BRIEF DESCRIPTION OF DRAWINGS

FIG. 2(*a*) is a diagram showing the relationship of an HPF output and an AGC output at a time when pulse noise is generated. FIG. 2(*b*) is a diagram showing the relationship of HPF output and AGC output at a time of electric field deterioration. FIG. 2(*c*) is a diagram showing the relationship of HPF output and AGC output at a time of electric field deterioration and when pulse noise is generated.

FIG. 3(*b*) is a diagram showing the frequency characteristics of an FM composite signal, a low-pass filter output, pulse noise, and background noise, when the electric field is weak.

FIG. 5(*b*) is a diagram showing an example of the waveform (sine wave) of an audio signal including pulse noise.

NUMERICAL REFERENCES

Figure 1:
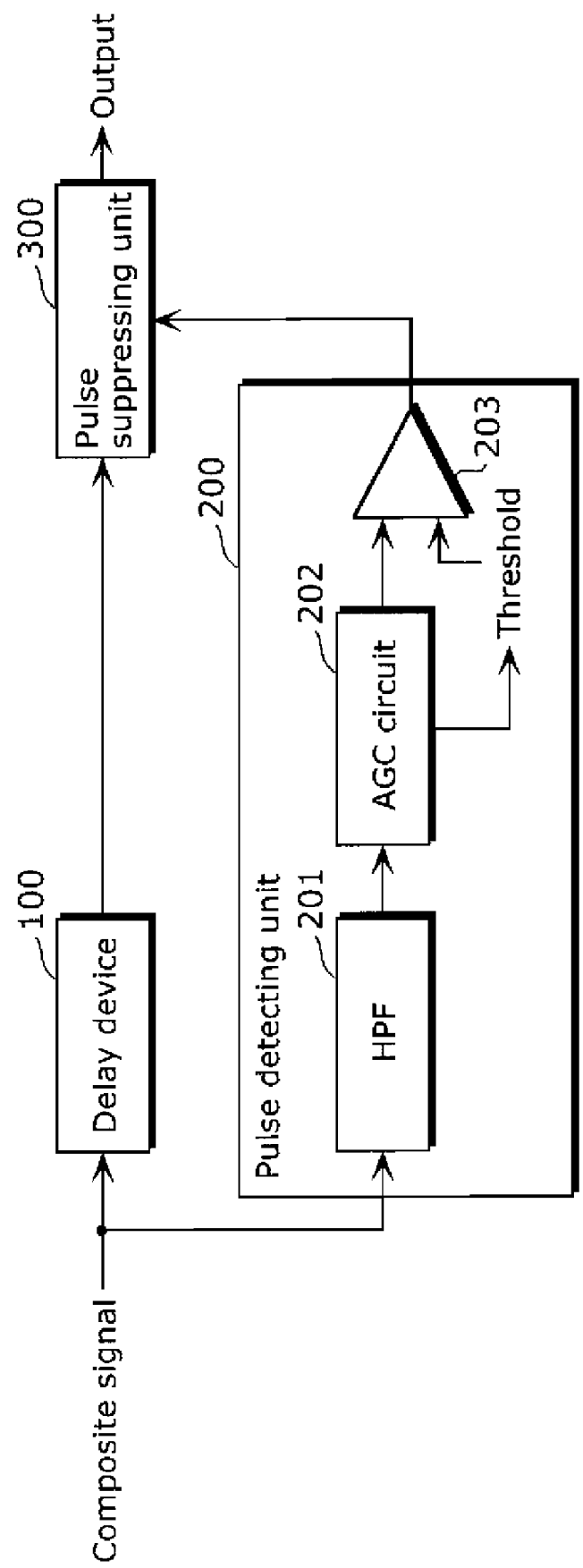
FIG. 1 is a block diagram showing the configuration of a conventional pulse noise canceller.
Figure 3A:
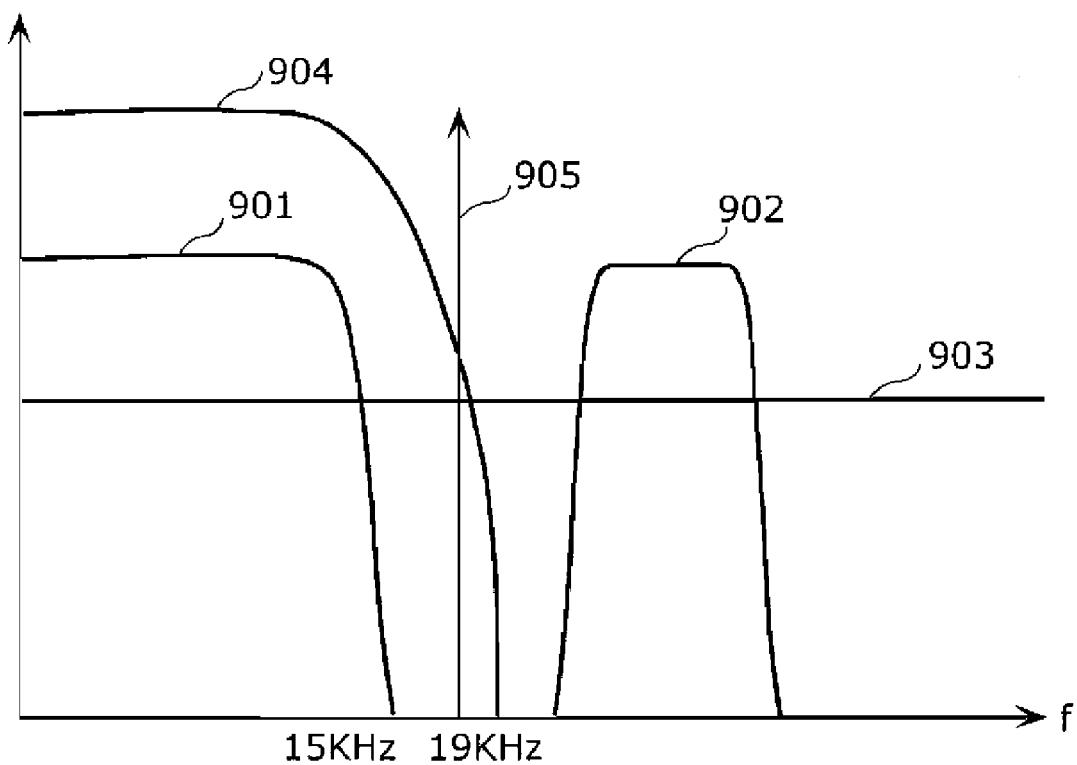
FIG. 3(*a*) is a diagram showing the frequency characteristics of an FM composite signal, a low-pass filter output, and pulse noise, when the electric field is strong.
Figure 3B:
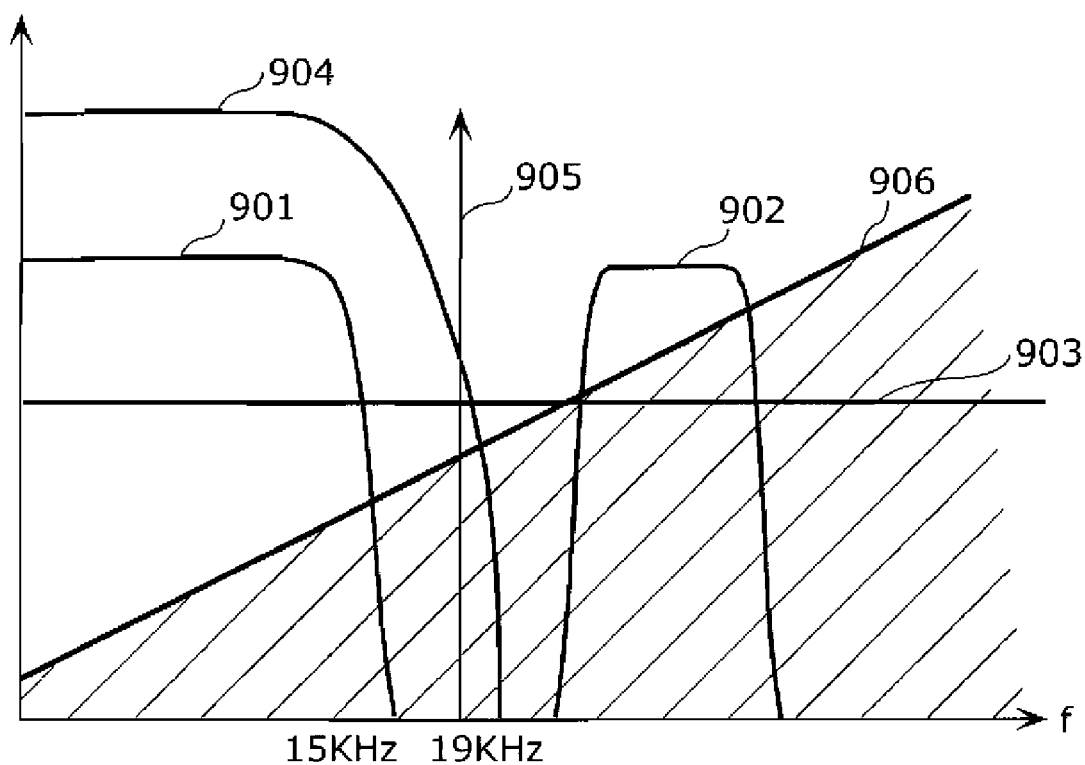

1 Antenna
2 Front end
3 IF processing unit
4 FM demodulation unit
5 Band limiting unit
51 Composite processing unit
6, 60, 600, 610 Noise suppressing unit
8 Weak electric field noise canceling unit
61 Delay device
62 Pulse detecting unit
63 Pulse judging unit
64 Pulse suppressing unit 65 Delay device
66 Comparator
67 Buffer
68, 69, 100 Delay device
70 Rise and fall detecting unit
71 Comparator
72 And circuit
200 Pulse detecting unit
201 High-pass filter
202 AGC circuit
203 Comparator
300 Pulse suppressing unit
801 FFT unit
802 Noise pattern storage unit
803 Subtractor
804 IFFT unit

BEST MODE FOR CARRYING OUT THE INVENTION

Hereinafter, embodiments of the present invention shall be described with reference to the drawings.

First Embodiment

Figure 4:
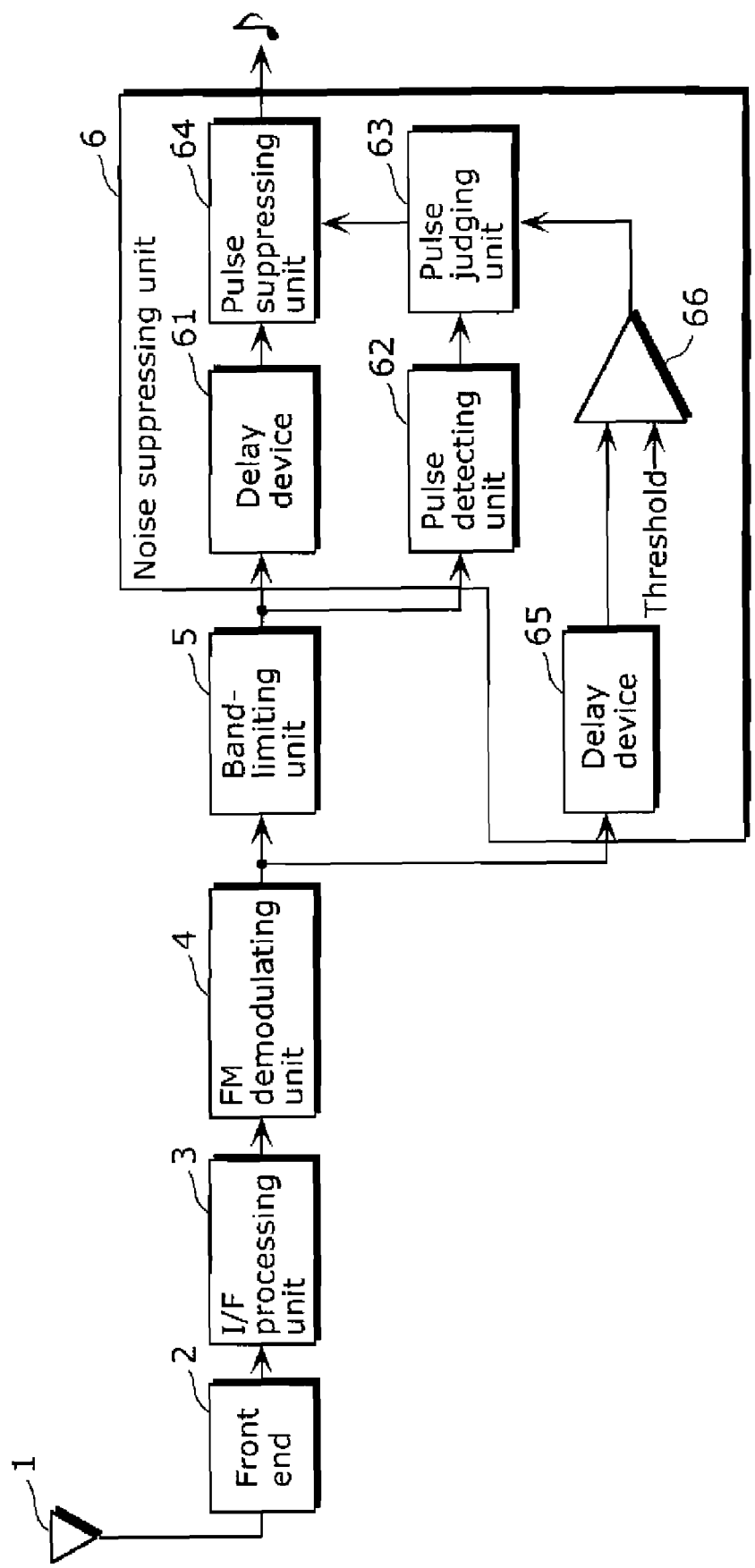
FIG. 4 is a block diagram showing the configuration of an FM radio receiver using the noise suppressing device of the present invention.

FIG. 4 is a block diagram showing the configuration of an FM radio receiver using the noise suppressing device of the present invention. The FM radio receiver shown in FIG. 4 is an FM radio receiver including the noise suppressing device (band-limiting unit and noise suppressing unit) of the present invention which, when electric field strength is low, extracts a low-frequency monaural audio signal from a composite signal, detects pulse noise included in the extracted monaural audio signal, and suppresses such pulse noise in the case where pulse noise is detected in the composite is signal at the same timing as the detected pulse noise. The FM radio receiver includes an antenna 1, a front end 2, an IF processing unit 3, an FM demodulating unit 4, a band-limiting unit 5, and a noise suppressing unit 6. In the FM radio receiver in FIG. 4, the antenna 1 receives a radio signal. The front end 2 converts the received radio signal into an intermediate-frequency (IF) signal. The IF processing unit 3 converts the IF signal to a baseband (BB) signal. The FM demodulating unit 4 demodulates the BB signal into a composite signal. When electric field strength is high, the band-limiting unit 5 extracts an (L+R) signal and a (L−R) signal from the composite signal including a high-frequency and, by mixing such signals, outputs an L and R stereo audio signal. On the other hand, when the electric field strength is low, the band-limiting unit 5 extracts, from the demodulated composite signal, only the low-frequencies, for example, only the band equal to or lower than 20 kHz, and outputs a monaural audio signal represented by the (L+R) signal. When the electric field strength is high, the noise suppressing unit 6 allows the stereo audio signal outputted from the band-limiting unit 5 to pass through, without doing anything. When the electric field is low, the noise suppressing unit 6 applies noise-suppression processing on the monaural audio signal outputted from the band-limiting unit 5 and subsequently outputs the noise-suppressed monaural audio signal to an external speaker or headphones, and so on, Specifically, the band-limiting unit 5 and the noise suppressing unit 6 include the functions of the "noise suppressing device which suppresses pulse noise included in a frequency-modulated signal at low electric field strength", and between them, the band-limiting unit 5 includes the function of the "band-limiting unit configured to band-limit a composite signal to a band equal to or lower than a predetermined frequency so as to output an audio signal, the composite signal being obtained by demodulating an FM baseband signal". Generally, in noise-suppression processing, aside from pulse noise cancellation, various sound-quality improvement techniques, such as separation control and high-cut, are proposed. However, in the present embodiment, only weak electric field pulse noise cancellation shall be described.

The noise suppressing unit 6, which is a weak electric field pulse noise canceller, includes a delaying device 61, a pulse detecting unit 62, a pulse judging unit 63, a pulse suppressing unit 64, a delaying device 65, and a comparator 66. The delaying device 61 delays the monaural audio signal which is the output of the band-limiting unit 5, by as much as the processing time by the pulse detecting unit 62. The pulse detecting unit 62 includes the functions of the "pulse detecting unit configured to detect pulse noise in the audio signal outputted by said band-limiting unit". Having the monaural audio signal outputted by the band-limiting unit 5 as an input, the pulse detecting unit 62 detects a pulse noise candidate and outputs a pulse detection signal. The pulse detecting unit 62 adopts the same configuration as the conventional pulse detecting unit which uses a high-pass filter, given in FIG. 1, for example. In other words, the pulse detecting unit 62 has the same configuration as with the pulse detecting unit 200 shown in FIG. 1, and detects pulse noise in an inputted audio signal and outputs a pulse detection signal. It should be noted that, here, the pulse detection signal may specifically be any signal as long as it indicates the detection or non-detection of pulse noise. Next, the pulse judging unit 63 judges whether or not the audio signal in the pulse detection interval is pulse noise. When the audio signal in the pulse detection interval is pulse noise, the pulse noise of the input audio signal that passed through the delay device 61 for the detection delay amount, is removed by the pulse suppression unit 64. The method for judging whether or not the audio signal in the pulse detection interval is pulse noise is as follows.

Figure 5A:
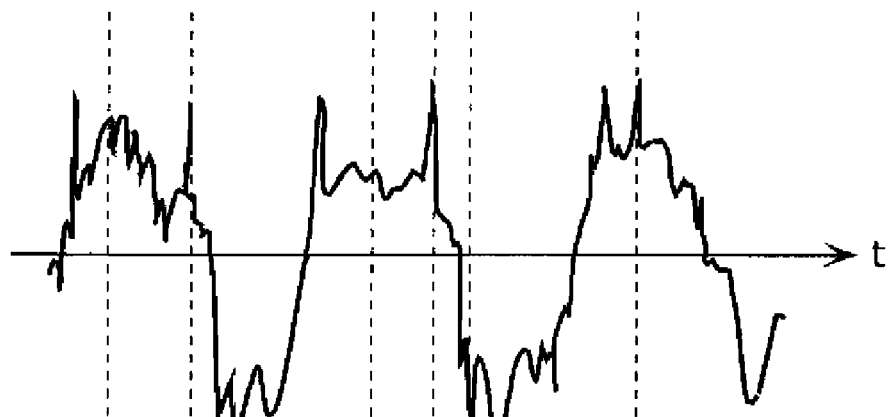
FIG. 5(*a*) is a diagram showing an example of the waveform of a composite signal including pulse noise.
Figure 5B:
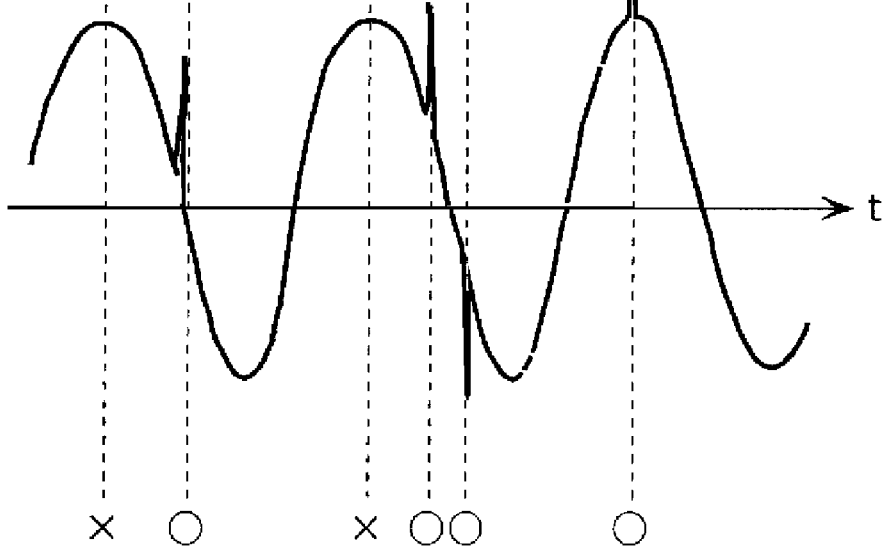

FIG. 5(a) is a diagram showing an example of the waveform of a composite signal including pulse noise. FIG. 5(b) is a diagram showing an example of the waveform (sine wave) of the audio signal including pulse noise. As shown in FIG. 5(a), when electric field strength is low, the composite signal includes a large number of high frequency components. On the other hand, as shown in FIG. 5(b), the audio signal, with the exception of the pulse noise, is a low-frequency signal. However, even with audio signals, the sound of the letter "s" in speech, and the like, is different from the waveform shown in FIG. 5(b) and includes a high-frequency component, and therefore, with the simple performance of gain adjustment on the output of the high-pass filter and comparison of the adjusted result with the threshold, there are instances of misdetection as pulse noise. However, as can be understood by comparing FIG. 5(a) and FIG. 5(b), there is a relationship between the composite signal and the audio signal in which, when pulse noise is included in the audio signal, pulse noise is also included in the composite signal at a corresponding position. Using this relationship, the pulse judging unit 63 judges whether or not the audio signal in the pulse detection interval is pulse noise in the following manner. Specifically, the pulse judging unit 63 compares, through the comparator 66, the composite signal which is kept synchronized with the pulse detection signal by the delay device 65, with a predetermined threshold (the "first threshold" in the Claims), and judges that the audio signal in the pulse detection interval is pulse noise in the case where the amplitude of the composite signal in the pulse detection interval exceeds the threshold. Furthermore, in the case where the amplitude of the composite signal in the pulse detection interval is equal to or lower than the threshold, the pulse judging unit 63 judges that the pulse noise detected in the audio signal is, for example, a sound of the letter "s" in speech or the sound of cymbals in music, and therefore a misdetected audio signal. In other words, the delay device 65, the comparator 66, and the pulse judging unit 63 include the functions of the "pulse judging unit having the composite signal as an input, and configured to judge that a detection result of said pulse detecting unit is valid in the case where pulse noise is included in the composite signal at a position corresponding to the pulse noise detected in the audio signal". Among them, the comparator 66 corresponds to the "first comparator which compares, with a first threshold, an amplitude of a full band of the inputted composite signal", and the pulse judging unit 63 includes the function to "judge that the detection result is valid in the case where the amplitude of the inputted composite signal exceeds the first threshold, at the position".

It should be noted that the pulse suppressing unit 64 includes the functions of the "pulse suppressing unit configured to suppress the pulse noise detected in the audio signal, in the case where said pulse judging unit judges that the detection result of said pulse detecting unit is valid", and suppresses the detected pulse noise by replacing, for example, the value of a sample of the audio signal in the pulse detection interval with the value of a sample immediately preceding the pulse detection interval. The delay device 65 delays the composite signal outputted from the FM demodulating unit 4, by as much as the processing time of the band-limiting unit 5 and the pulse detecting unit 62, so as to synchronize the pulse detection signal and the composite signal. The comparator 66 compares the delayed composite signal and the threshold and outputs the comparison result to the pulse judging unit 63. The comparator 66 outputs, for example, "1" in the case where, as a result of the comparison between the composite signal and the threshold, the composite signal exceeds the threshold; and outputs "0" in the case where the composite signal is equal to or lower than the threshold. In the case where, for example, the pulse detection signal is assumed to be a signal "1" in the state where pulse noise is detected and a signal "0" in the state where pulse noise is not detected, the pulse judging unit 63 obtains the logical AND of the output of the comparator 71 and the output of the comparator 66 and judges that the audio signal in the pulse detection interval is pulse noise when the logical AND is "1", and judges misdetection when the logical AND is "0".

According to the above-described present embodiment, since the pulse detecting unit 62 detects the pulse noise included in a monaural audio signal at the time when the electric field is weak, it is possible to detect a pulse noise candidate at a frequency band where background noise has a lesser impact. In addition, the pulse judging unit 63 compares, with the threshold, the amplitude of the composite signal that is synchronized with the audio signal, and verifies whether or not the pulse noise candidate detected by the pulse detecting unit 62 is a misdetection. Therefore, since pulse noise is not judged based only on either one of the audio signal or the composite signal, and since the pulse noise candidate detected from the audio signal is verified by looking at the amplitude of the composite signal, there is the advantageous effect of being able to judge pulse noise with even more accuracy.

<First Modification of the First Embodiment>

Figure 6:
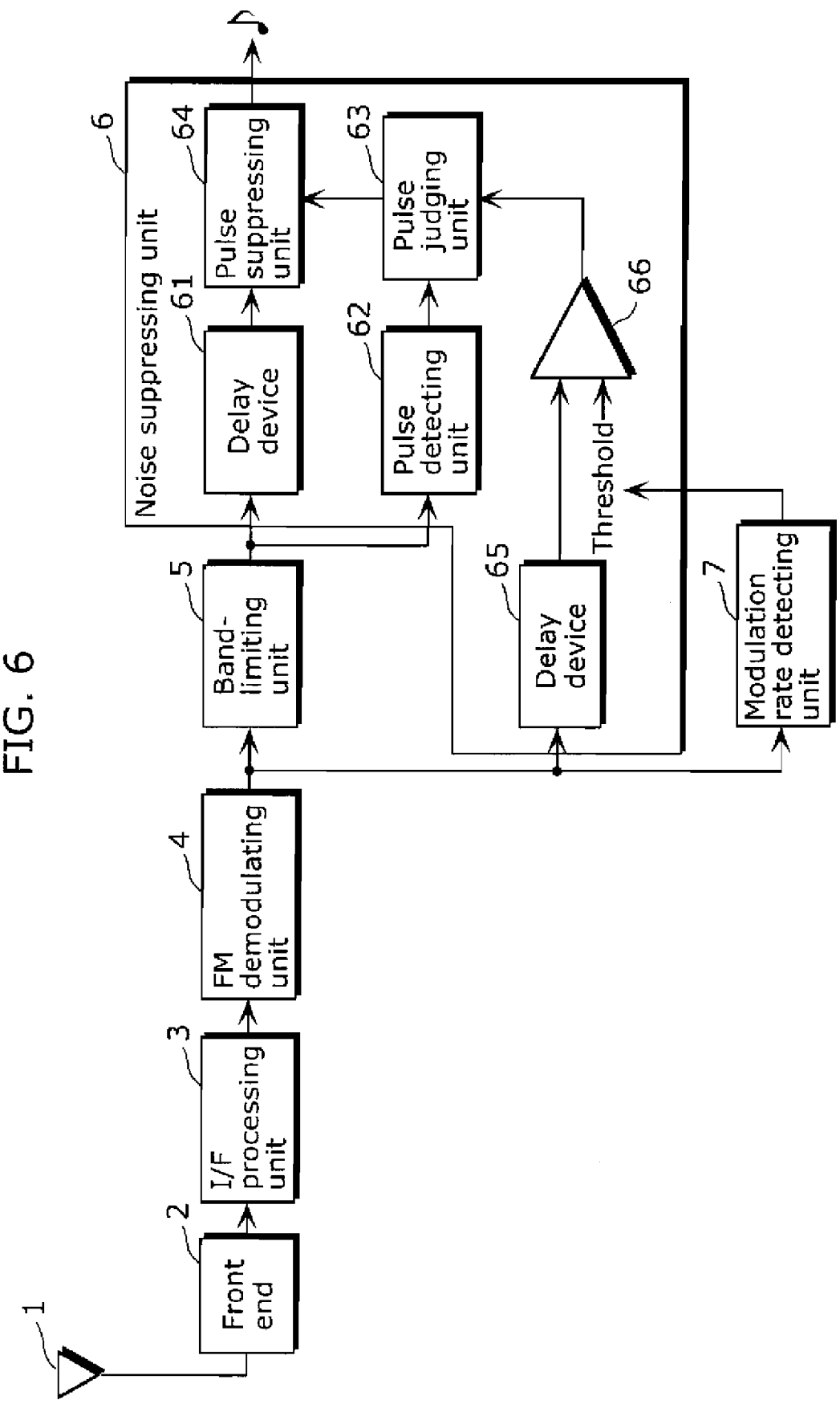
FIG. 6 is a block diagram showing the configuration of an FM radio receiver including a modulation rate detecting unit.

It should be noted that the threshold (the "first threshold" in the Claims) with which the amplitude of the composite signal is compared by the comparator 66 may also be a value which can be varied according to the rate of modulation of the FM signal. The rate of modulation is the value indicating the relationship between the amplitude of the signal to be modulated (=original sound source) and the frequency of the modulated signal (=FM modulated signal). More specifically, the maximum amplitude of the signal to be modulated becomes an amplitude of a modulated signal of 75 kHz at 100 percent modulation, and the same amplitude becomes an amplitude of a modulated signal of 150 kHz at 200 percent modulation. FIG. 6 is a block diagram showing the configuration of an FM radio receiver including a modulation rate detecting unit 7. The modulation rate detecting unit 7 includes the functions of the "modulation rate detecting unit configured to detect a rate of modulation of the frequency-modulated signal, and to generate the first threshold according to the detected modulation rate", and calculates the modulation rate based on, for example, the short-time average of the amplitude of the composite signal outputted from the FM demodulating unit 4. In addition, the modulation rate detecting unit 7 outputs a threshold voltage corresponding to the calculated modulation rate. For example, the modulation rate detecting unit 7 calculates a threshold voltage corresponding to the modulation rate by multiplying the calculated modulation rate by a fixed value threshold. Furthermore, the comparator 66 includes the functions of the "first comparator which compares the amplitude of the composite signal with the first threshold generated by said modulation rate detecting unit".

As described thus far, according to the first embodiment, by making the threshold of the comparator 66 variable according to the modulation rate, it is possible to actively set a more appropriate threshold independently of the sound source. More specifically, for example, there is the problem that the optimal value of the threshold at a locality where the modulation rate is 100 percent modulation will be too high a threshold for a locality where the modulation rate is 50 percent modulation. However, by making the threshold of the comparator 66 variable according to the modulation rate, such difference between localities can be absorbed. Accordingly, there is the advantageous effect that the noise suppressing unit 6 can suppress pulse noise with greater accuracy even when the vehicle equipped with the FM radio receiver moves between localities having different modulation rates.

<Second Modification of the First Embodiment>

Figure 7:
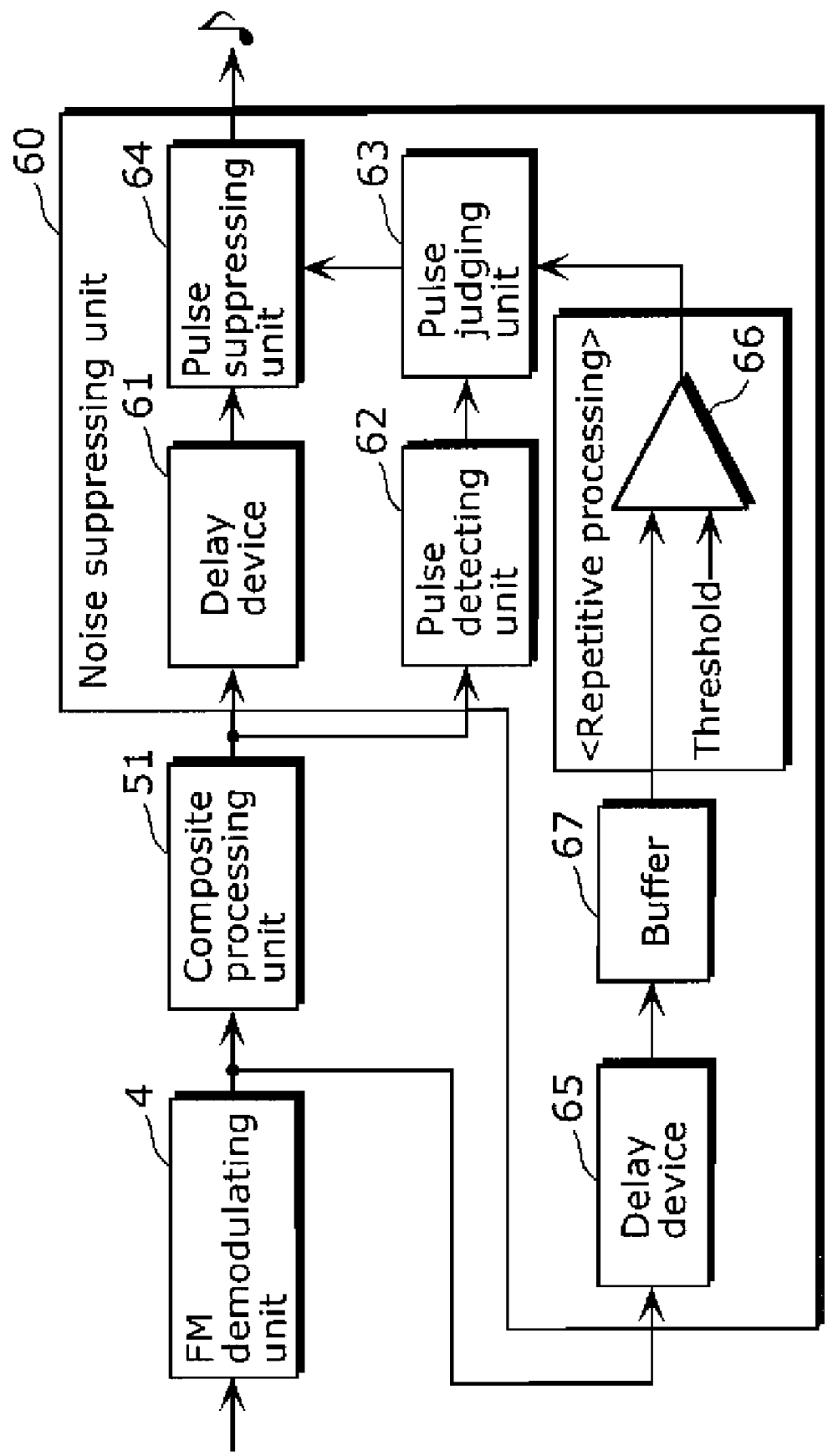
FIG. 7 is a block diagram showing the configuration of an FM radio receiver including a composite processing unit.

FIG. 7 is a block diagram showing the configuration of an FM radio receiver including a composite processing unit 51. In the diagram, since the stages preceding the FM demodulating unit 4 are the same as in the FM radio receiver shown in FIG. 4, only the stages after the FM demodulating unit 4 are illustrated. As shown in FIG. 7, the FM radio receiver in the second modification includes the FM demodulating unit 4, the composite processing unit 51, and a noise suppressing unit 60. The noise suppressing unit 60 includes the delaying device 61, the pulse detecting unit 62, the pulse judging unit 63, the pulse suppressing unit 64, the delaying device 65, the comparator 66, and a buffer 67. In the FM radio receiver, in general, band-limiting in the same manner as with the band-limiting unit 5 and, in addition, downsampling are performed on the composite signal within the composite processing unit 51. In the second modification, it is assumed that the composite signal has a sampling frequency of 320 kHz while, on the other hand, a monaural audio signal has a sampling frequency of 40 kHz. Since ⅛ downsampling is performed on the composite signal through composite processing in the composite processing unit 51, for one sample of the monaural audio signal, there are eight samples of the composite signal. Since a pulse detection signal is outputted for every one sample of the monaural audio signal, this means that for one sample of the pulse detection signal, there are eight samples of the composite signal. Consequently, as shown in FIG. 7, the buffer 67 is provided ahead of the comparator 66, and for one sample of the audio signal, eight samples of the component signal are held in the buffer 67. Accordingly, the comparison by the comparator 66 is performed for eight samples with respect to one sample of the pulse detection signal, and then pulse judgment is performed. In this case, the pulse judging unit 63 judges that the audio signal in the pulse detection interval is pulse noise when even one sample among the eight samples, for example, exceeds the threshold.

As described above, according to the noise suppressing unit 60 in the first embodiment, for one sample of the audio signal, in this case, for example, verification for whether or not it is a pulse noise is performed using eight samples of the composite signal, and thus there is the advantageous effect of being able to more accurately judge and suppress pulse noise.

Second Embodiment

Figure 8:
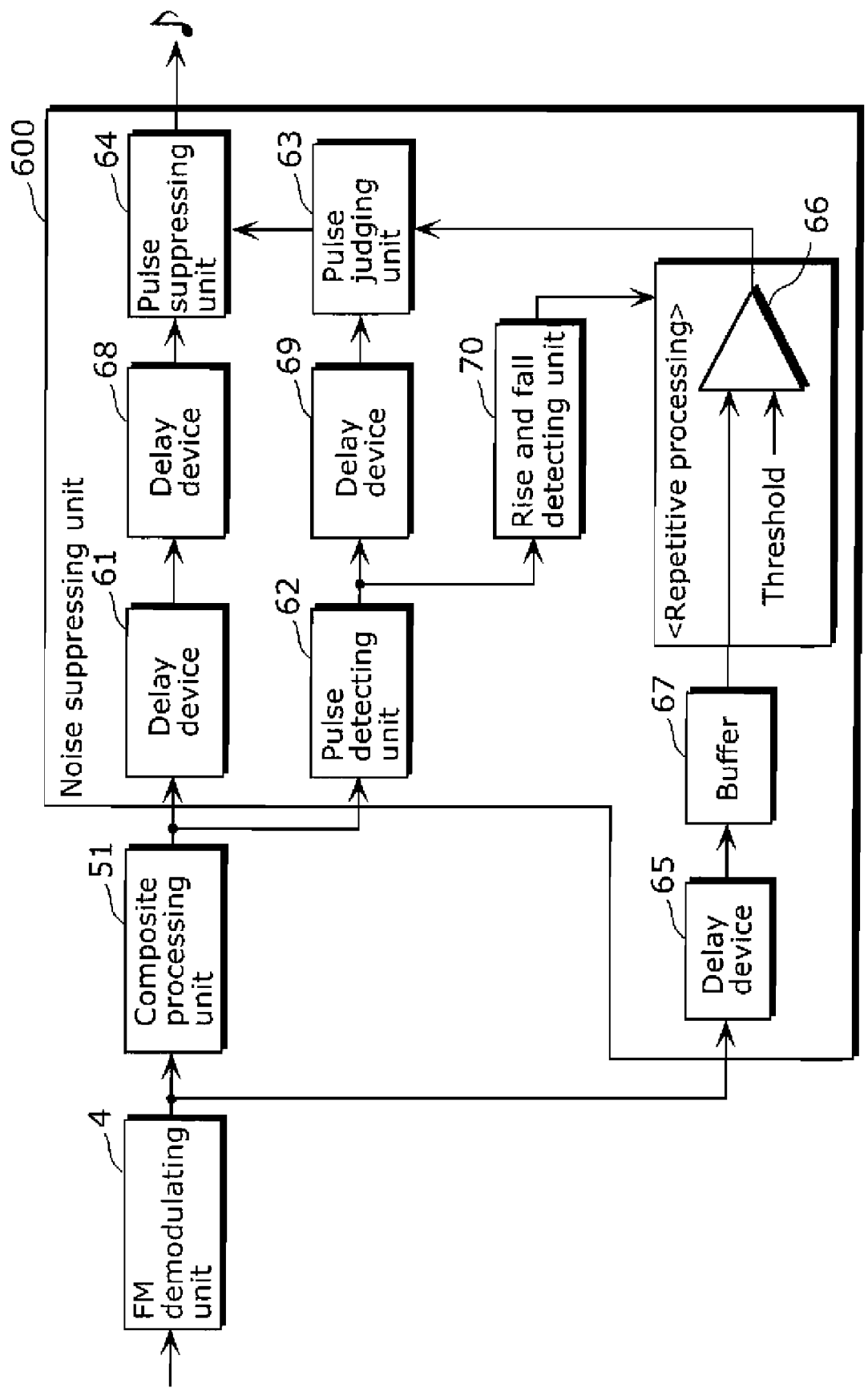
FIG. 8 is a block diagram showing the configuration of an FM radio receiver using a weak electric field pulse noise canceller in a second embodiment of the present invention.

FIG. 8 is a block diagram showing the configuration of an FM radio receiver using a weak electric field pulse noise canceller in a second embodiment of the present invention. In the diagram, description of the antenna 1, front end 2, and IF processing unit 3, which have the same functions as in FIG. 4, is omitted. Furthermore, the input to the FM demodulating unit 4 is a BB signal as in FIG. 4. The FM radio receiver in the second embodiment includes the FM demodulating unit 4, the composite processing unit 51, and a noise suppressing unit 600. The noise suppressing unit 600 has the interval from the rise to the fall of the pulse detection signal as a pulse detection interval, and judges whether or not a signal detected, as a pulse noise candidate, within this pulse detection interval is pulse noise. When the signal is judged as being pulse noise, the noise suppressing unit 600 suppresses such pulse noise. The noise suppressing unit 600 includes the delaying device 61, the pulse detecting unit 62, the pulse judging unit 63, the pulse suppressing unit 64, the delaying device 65, the comparator 66, the buffer 67, a delay device 68, a delay device 69, and a rise and fall detecting unit 70.

Hereinafter, the difference between the first embodiment shall be described. The pulse detecting unit 62 includes the functions of the "pulse detecting unit which: includes a high-pass filter (HPF 201 in FIG. 1) having the audio signal as an input, and a second comparator (comparator 203 in FIG. 1) which compares an output of said high-pass filter with a second threshold; and is configured to output a pulse detection signal that rises when an output of said high-pass filter exceeds the second threshold, and falls when the output of said high-pass filter is equal to or lower than the second threshold".

The rise and fall detecting unit 70 monitors a pulse detection signal outputted when a pulse noise candidate is detected by the pulse detection unit 62, and detects the rise and fall of the pulse detection signal. More specifically, the rise and fall detecting unit 70 includes the functions of the "rise and fall detecting unit configured to detect the rise and the fall of the pulse detection signal outputted by said pulse detecting unit, and to measure an interval of the pulse noise detected in the audio signal". The rise and fall detecting unit 70 outputs a rise signal as a detection result when it detects the rise of the pulse detection signal, and outputs a fall signal as the detection result when it detects the fall of the pulse detection signal. With regard to the comparison of the composite signal amplitude by the comparator 66, comparison is started with the rise signal outputted by the rise and fall detecting unit 70, and the comparison ends with the fall signal. The pulse judging unit 63 judges that an audio signal within the pulse detection interval is pulse noise when, for example, even one sample within the pulse detection interval from the point at which the comparison is started according to the rise signal up to the fall signal, exceeds the threshold. In other words, the pulse detecting unit 63 includes the functions of the "pulse judging unit configured to judge that the detection result is valid, in the case where the amplitude of the composite signal within the interval measured by said rise and fall detecting unit exceeds the first threshold a predetermined number of times or more". More specifically, the rise signal indicates the start point of one pulse noise, and the fall signal indicates the end point of the same pulse noise. The composite signal in the interval from the rise signal to the fall signal corresponds to all the composite signals corresponding to one pulse noise in the audio signal. For example, as exemplified in the first embodiment, in the case of 320 kHz sampling for the composite signal and 40 kHz sampling for the audio signal, when three samples are successively detected as a pulse noise candidate by the pulse noise detecting unit 62, amplitudes of 3×8=24 samples of the composite signal are sequentially compared with the threshold. When, for example, even one sample from among the 24 samples exceeds the threshold, the pulse noise candidate is judged as being pulse noise. The delay device 68 and the delay device 69 have the same number of delays, and delay the audio signal by as much as the number of samples between the rise signal and the fall signal.

Furthermore, in this case, the pulse detecting unit 64 can suppress pulse noise by holding, for example, the value of the sample of the audio signal immediately preceding the rise of the pulse detection signal and replacing, with the held value, the value of the sample of the audio signal from the rise to the fall of the pulse detection signal.

<First Modification of the Second Embodiment>

Figure 9:
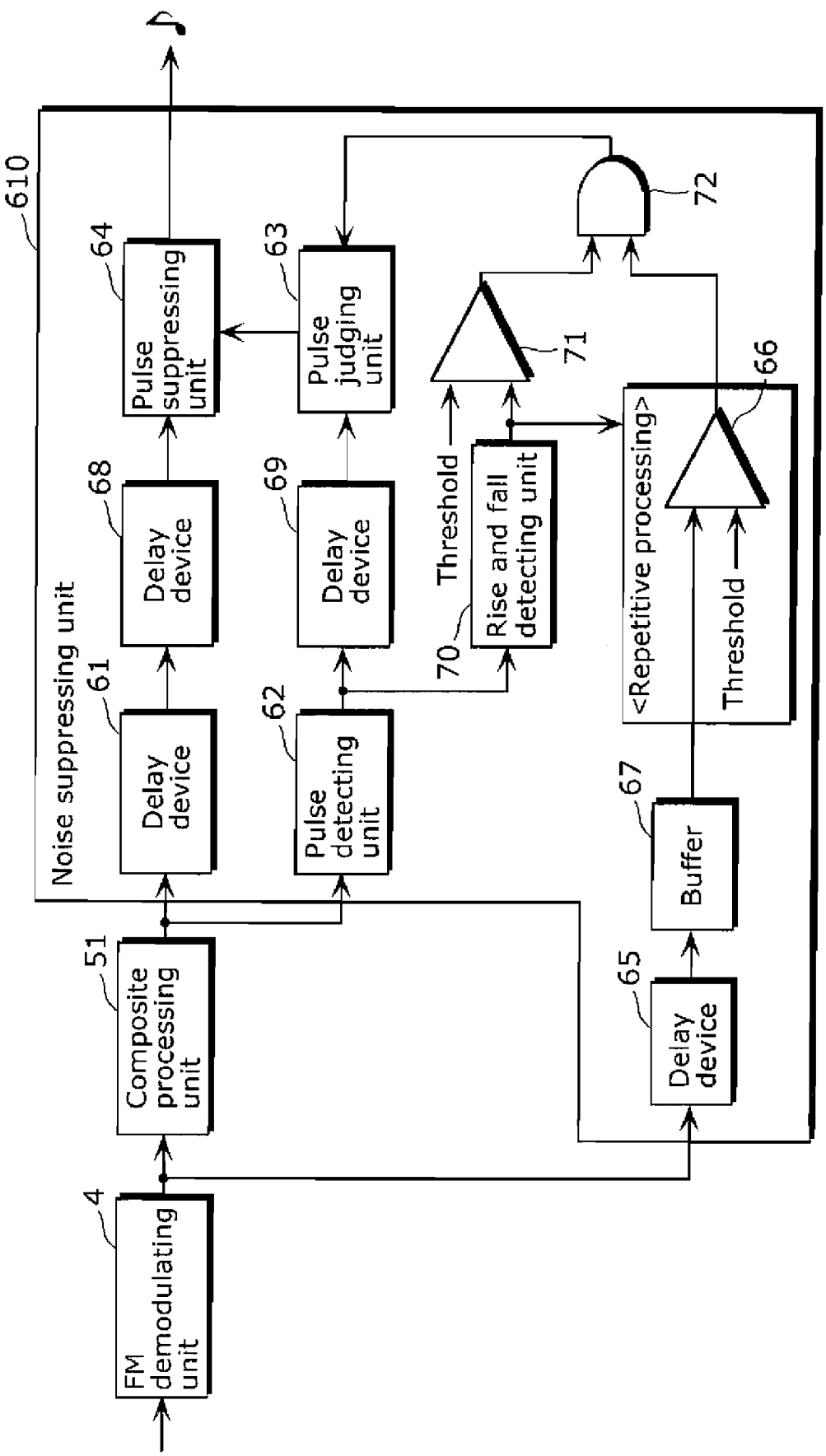
FIG. 9 is a block diagram showing the configuration of an FM radio receiver which is a first modification of the second embodiment.

In addition, by detecting the rise and fall of the pulse detection signal through the rise and fall detecting unit 70, even higher-accuracy pulse noise judgment can be performed by measuring the pulse detection interval length for which the pulse noise candidate is detected, and adding the result to the judgment condition. For example, by performing judgment in which the pulse judging unit 63 judges that a pulse noise candidate is pulse noise when even one sample within the pulse detection interval in which the pulse noise candidate is detected exceeds the threshold, and the pulse detection interval length for the pulse noise candidate is equal to or less than a predetermined length, the frequency of misdetection can be significantly reduced. FIG. 9 is a block diagram showing the configuration of an FM radio receiver which is a first modification of the second embodiment. The FM radio receiver is an FM radio receiver which suppresses pulse noise, by taking into consideration the pulse detection interval length for which the pulse noise candidate is detected, in the judgment by the pulse detecting unit 63. The FM radio receiver includes the FM demodulating unit 4, the composite processing unit 51, and a noise suppressing unit 610. The noise suppressing unit 610 includes the delaying device 61, the pulse detecting unit 62, the pulse judging unit 63, the pulse suppressing unit 64, the delaying device 65, the comparator 66, the buffer 67, a delay device 68, a delay device 69, the rise and fall detecting unit 70, a comparator 71 and an AND circuit 72.

Hereinafter, constituent elements of the noise suppressing unit 610 that are different from those of the noise suppressing unit 600 shown in FIG. 8 shall be described. Unlike the comparator 66, the comparator 71 does not compare the voltages of two inputs, and instead compares, with a predetermined threshold (the "third threshold" in the Claims), the number of samples from the rise signal to the fall signal outputted by the rise and fall detecting unit 70. The threshold value is given as an integer of about 3 to 5, for example, since the number of samples of pulse noise included in an audio signal is generally 3 to 5 samples. The comparator 71 outputs "1" when the number of samples from the rise signal to the fall signal is equal to or less than the threshold, and outputs "0" when the number of samples from the rise signal to the fall signal exceeds the threshold.

For every one sample of a pulse noise candidate, the comparator 66 compares, with the threshold voltage, the amplitude of eight samples of the composite signal, and outputs "1" when even one sample among the eight samples exceeds the threshold. The comparator 66 outputs "0" when one of the eight samples of the composite signal exceed the threshold.

The AND circuit 72 outputs the logical AND of the output of comparator 66 and the output of the comparator 71. The pulse judging unit 63 judges that the sample which is the pulse noise candidate is actually pulse noise when the pulse detection signal outputted from the delay device 69 indicates the state in which a pulse noise candidate has been detected, and the output from the AND circuit is "1", and judges that the pulse noise candidate is a misdetected audio signal when the output from the AND circuit is "0". In other words, the comparator 71, the AND circuit 72, and the pulse detecting unit 63 include the functions of the "pulse judging unit configured to judge that the detection result is valid, only in the case where a length of the interval measured by said rise and fall detecting unit is equal to or less than a third threshold". The pulse detecting unit 64 suppresses pulse noise by holding the value of the so sample of the audio signal immediately preceding the rise of the pulse detection signal and replacing, with the held value, the value of the sample of the audio signal detected as pulse noise in the interval from the rise to the fall of the pulse detection signal.

As described thus far, according to the present embodiment, there is the advantageous effect of being able to more-accurately judge and suppress pulse noise since the noise suppressing unit 610 judges that a pulse noise candidate is not pulse noise in the case where the length of the interval in which the pulse noise candidate is detected, that is, the interval from the rise to the fall of the pulse detection signal is longer than the predetermined threshold (the standard pulse width of pulse noise).

It should be noted that although in the present embodiment, an audio signal is judged to be pulse noise when, for one sample of the audio signal detected as a pulse noise candidate, even one of the samples of the composite signal exceeds the threshold, the present invention is not limited to such condition. For example, it is also possible to judge that one sample of the audio signal is pulse noise when, for the one sample of the audio signal detected as a pulse noise candidate, the majority of the samples of the composite signal exceeds the threshold. Furthermore, it is also possible to judge that a sample of the audio signal is pulse noise when two samples (or a predetermined number of samples) or more of the composite signal successively exceed the threshold, and it is also possible to judge that a sample of the audio signal is pulse noise when all the samples of the composite signal exceed the threshold.

Furthermore, although it is described that in the aforementioned embodiment, the number of samples from the rise signal to the fall signal and the number of samples which is the threshold are compared by the comparator 71, comparison need not be carried out based on the number of samples. It is also possible, for example, to measure the time from the rise signal to the fall signal, using a timer, and compare such time with a time that is the threshold.

It should be noted that although it is described in the aforementioned embodiment that the pulse suppressing unit 64 suppresses the detected pulse noise by replacing the value of a sample of the audio signal in the pulse detection interval with the value of a sample immediately preceding the pulse detection interval, the present invention is not limited to such, and pulse noise may also be suppressed using other methods. For example, it is also possible to obtain the average value of the value of a sample immediately preceding the pulse detection interval and the value of a sample immediately after the pulse detection interval, and replace the value of the sample of the audio signal within the pulse detection interval with the obtained value.

It should be noted that although it is described that in the aforementioned embodiment, the validity of the pulse detection signal is judged by comparing, with the threshold, the amplitude of the full band of the composite signal, the validity of the pulse detection signal may also be judged by comparing only the high frequency of the composite signal and the threshold.

Third Embodiment

Figure 10:
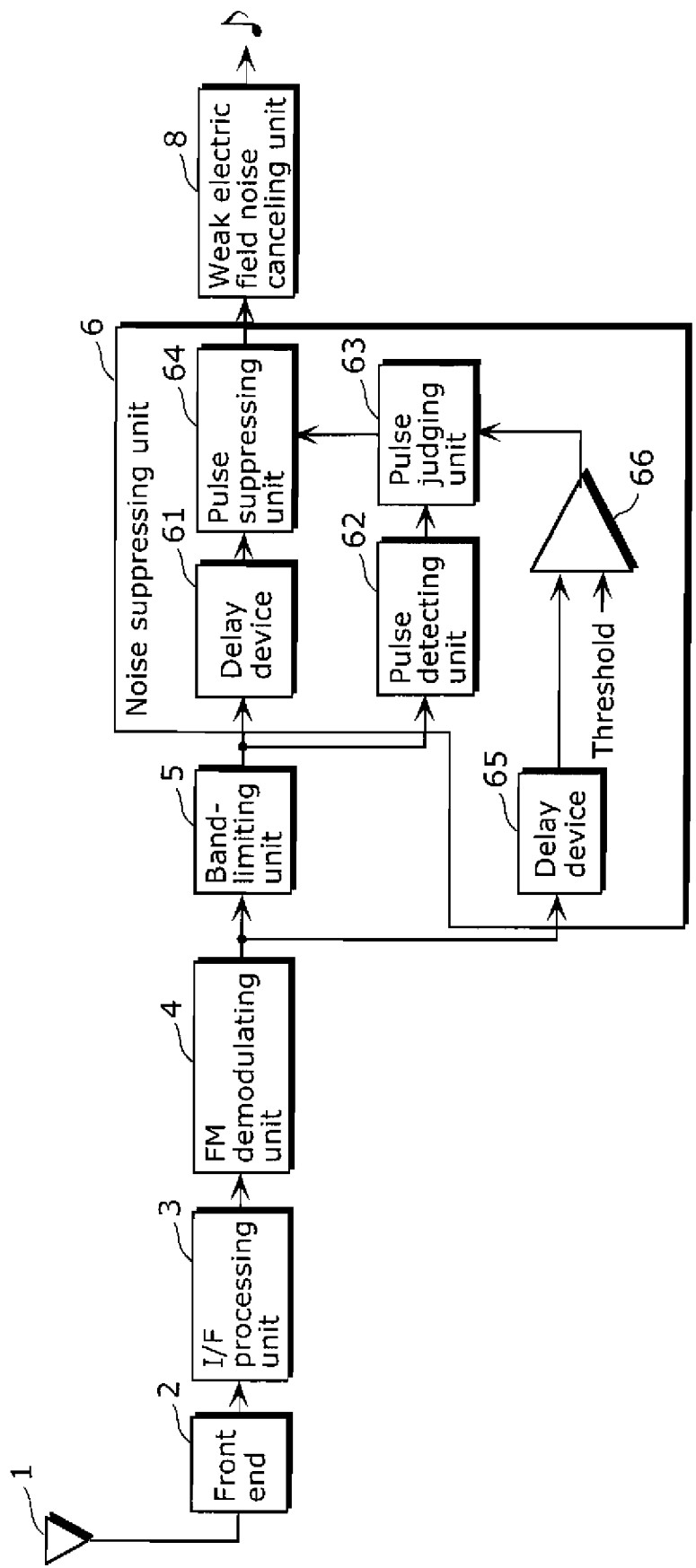
FIG. 10 is a block diagram showing the configuration of the FM radio receiver in the third embodiment, which includes a weak electric field noise canceling unit in a stage after the noise suppressing unit shown in FIG. 4.
Figure 11:
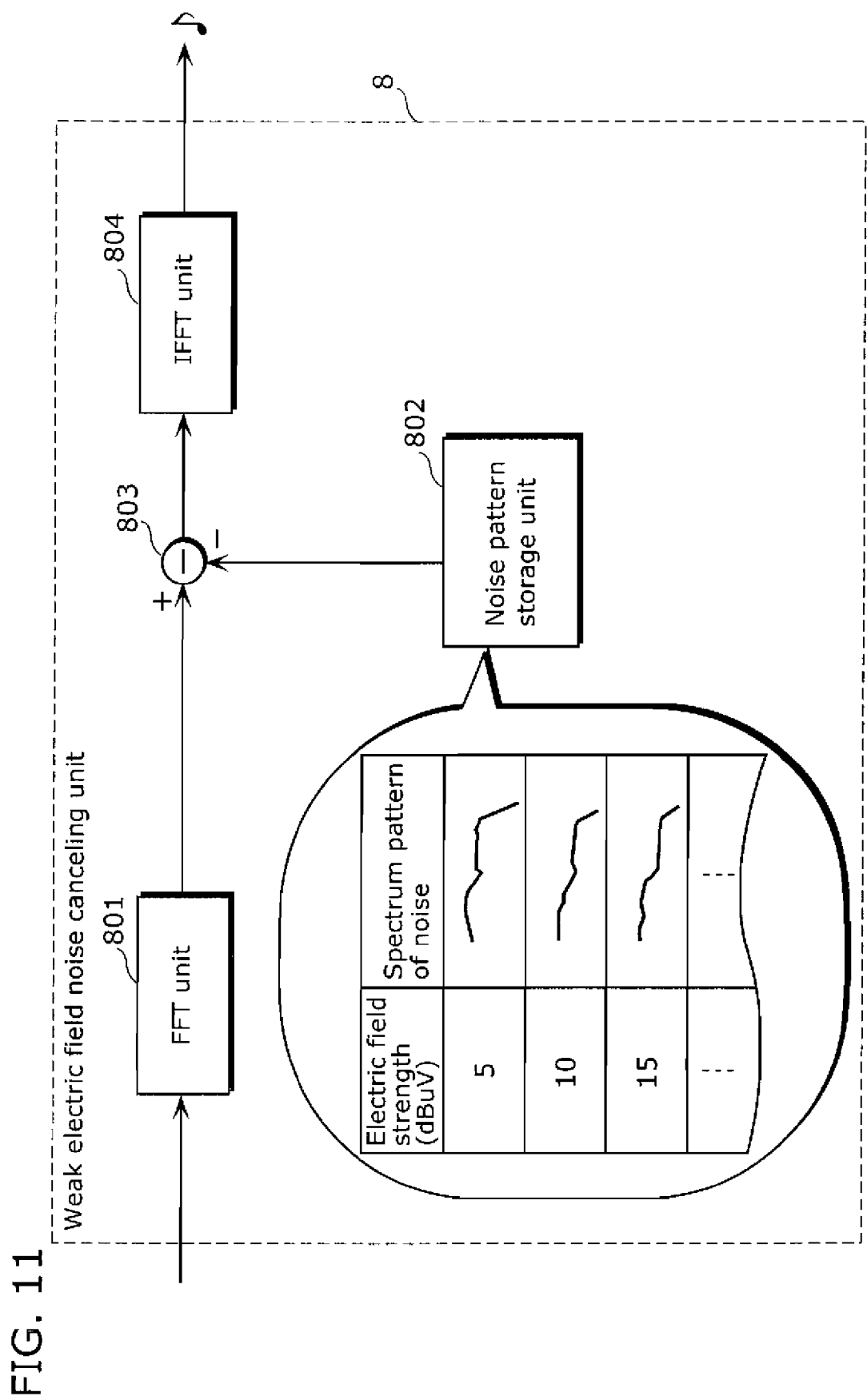
FIG. 11 is a block diagram showing the internal configuration of the weak electric field noise canceling unit shown in FIG. 10.

It should be noted that the aforementioned embodiment describes the case where, after the noise suppressing unit 6 applies noise suppression processing (removal of weak electric field pulse noise) to the monaural audio signal outputted from the band-limiting unit 5, the noise-suppressed monaural signal is then outputted to an external speaker or headphones. However, the present invention is not limited to such case. For example, it is also possible to have a configuration which further includes, in a stage after the noise suppressing unit, a weak electric field noise canceling unit 8 which cancels weak electric field noise (weak electric field white noise). FIG. 10 is a block diagram showing the configuration of an FM radio receiver which includes the weak electric field noise canceling unit 8 in a stage after the noise suppressing unit shown in FIG. 4. The FM radio receiver shown in FIG. 10 internally includes an electric field strength measuring unit, not shown in the diagram, which measures the reception electric field strength of an FM radio signal received by the antenna 1. This electric field strength measuring unit includes the functions of the "electric field strength measuring unit configured to measure electric field strength of the audio signal that is received". FIG. 11 is a block diagram showing the internal configuration of the weak electric field noise canceling unit 8 shown in FIG. 10.

As shown in FIG. 11, the weak electric field noise canceling unit 8 includes a Fast Fourier Transform (FFT) unit 801, a noise pattern storage unit 802, a subtractor 803, and an Inverse Fast Fourier Transform (IFFT) unit 804. As already described in the previous embodiments, the audio signal outputted from the noise suppressing unit of the present invention is a signal in a time domain, that allows reproduction of audio by being outputted as-is to a speaker or headphones. In contrast, the noise cancellation by the weak electric field noise canceling unit 8 is performed by spectrum subtraction in a frequency domain. FFT unit 801 includes the functions of the "frequency transforming unit configured to transform the audio signal, in a time domain, of which pulse noise has been suppressed by said pulse suppressing unit, into a frequency spectrum in a frequency domain" and transforms the audio signal outputted from the noise suppressing unit, into a spectrum in a frequency domain by Fast Fourier Transform. The noise pattern storage unit 802 includes the functions of "noise pattern storage unit configured to store, for each of predetermined electric field strengths, a noise pattern represented by a frequency spectrum", and stores the spectrum pattern of the weak electric field white noise for each predetermined electric field strength. The subtractor 803 includes the functions of the "spectrum subtracting unit configured to read, from said noise pattern storage unit, a noise pattern corresponding to the electric field strength measured by said electric field strength measuring unit, and to subtract the noise pattern from the frequency spectrum obtained by the frequency transforming unit". The subtractor 803 subtracts the spectrum pattern of the weak electric strength white noise read from the noise pattern storage unit 802, from the frequency spectrum of the frequency-transformation by the FFT unit 801. The spectrum pattern read from the noise pattern storage unit 802 corresponds to the electric field strength when the audio signal, which is the frequency spectrum from which such spectrum pattern is to be subtracted, is received as an FM radio signal. In other words, the electric field strength at which the spectrum pattern is read from the noise pattern storage unit 802 can be obtained using the average of the reception electric field strengths of each of the audio signal samples for one frame which is the unit of the frequency transformation by the FFT unit 801. Accordingly, it is possible to obtain a frequency spectrum from which weak electric field white noise has been removed, in addition to the removal of the weak electric field pulse noise from the received monaural input signal. The IFFT unit 804 transforms the frequency spectrum obtained in such manner, into an audio signal in the time domain, by Inverse Fast Fourier Transform. Specifically, the IFFT unit 804 includes the functions of the "inverse frequency transforming unit configured to inverse-frequency transform a frequency spectrum that is a result of the subtraction by said spectrum subtraction, from a frequency spectrum in a frequency domain into an audio signal in a time domain". The audio signal in the time domain, outputted from the IFFT unit 804, is outputted to a speaker, headphones, and the like, and reproduced as audio.

As described above, the FM radio receiver in the third embodiment performs a processing of removing weak electric field white noise by performing spectrum subtraction in a frequency domain, on the audio signal from which weak electric field pulse noise has been removed by the noise suppressing unit 6. Accordingly, since pulse noise can be removed before applying spectrum subtraction, it is possible to prevent the padding (fixed value addition) of the spectrum of the audio signal due to the spectrum of the pulse noise, and thus there is the advantageous effect of being able to more-accurately remove weak electric field white noise.

It should be noted that although the aforementioned third embodiment describes an example which combines the noise suppressing unit 6 shown in FIG. 4 and the weak electric field noise canceling unit 8, the same advantageous effect can be obtained even when the weak electric field noise canceling unit 8 is combined with the noise suppressing unit of any of the embodiments of the present invention.

Furthermore, although the aforementioned third embodiment describes the case of transforming an audio signal in the time domain, into a spectrum in the frequency domain, using Fast Fourier Transform, the method for frequency transformation is not limited to Fast Fourier Transform and other frequency transformation methods, such as discrete cosine transform (DCT) and modified discrete cosine transform (MDCT) may also be used.

It should be noted that each function block after the FM demodulating unit 4 in the block diagrams (FIGS. 4, 6, 7, 8, 9, 10, and 11) is typically implemented as a combination of a Digital Signal Processor (DSP) provided on an LSI which is an integrated circuit, and software executed in the DSP. Furthermore, depending on the case, the IF processing unit 3 may also be provided in the LSI. These functions blocks may be individually configured as single chips or may be configured so that a part or all of the function blocks are included in a single chip.

Furthermore, function blocks other than a memory may be configured as a single chip.

Although an LSI is mentioned here, the integrated circuit can also be called an IC, a system LSI, a super LSI, and an ultra LSI, depending on the degree of integration.

Furthermore, the method of circuit integration is not limited a to LSIs, and implementation through a dedicated circuit or a general-purpose processor is also possible. A Field Programmable Gate Array (FPGA) which allows programming after LSI manufacturing or a reconfigurable processor which allows reconfiguration of the connections and settings of the circuit cells inside the LSI may also be used.

In addition, depending on the emergence of circuit integration technology that replaces LSI due to progress in semiconductor technology or other derivative technology, it is obvious that such technology may be used to integrate the function blocks. Possibilities in this regard include the application of biotechnology and the like.

In addition, each of the function blocks may be configured of dedicated hardware configured of a logical circuit, and the like.

INDUSTRIAL APPLICABILITY

The noise suppressing device of the present invention is useful as a sound quality improvement technique in an FM radio receiver. In particular, the noise suppressing device of the present invention is suitable as a sound quality improvement technique for a radio receiver built into a mobile radio or a mobile phone for which deterioration of electric field strength occurs due to the movement of a person or vehicle, and so on, and for an in-vehicle radio receiver.

The invention claimed is:

1. A noise suppressing device which suppresses pulse noise included in a frequency-modulated signal at low electric field strength, said noise suppressing device comprising:
    a band-limiting unit configured to band-limit a composite signal to a band equal to or lower than a predetermined frequency so as to output an audio signal, the composite signal being obtained by demodulating an FM baseband signal;
    a pulse detecting unit configured to detect pulse noise in the audio signal outputted by said band-limiting unit;
    a pulse judging unit having the composite signal as an input, and configured to judge that a detection result of said pulse detecting unit is valid in the case where pulse noise is included in the composite signal at a position corresponding to the pulse noise detected in the audio signal; and
    a pulse suppressing unit configured to suppress the pulse noise detected in the audio signal, in the case where said pulse judging unit judges that the detection result of said pulse detecting unit is valid.

2. The noise suppressing device according to claim 1, wherein said pulse judging unit:
    includes a first comparator which compares, with a first threshold, an amplitude of a full band of the inputted composite signal; and
    is configured to judge that the detection result is valid in the case where the amplitude of the inputted composite signal exceeds the first threshold, at the position.

3. The noise suppressing device according to claim 1, wherein said pulse detecting unit:
includes a high-pass filter having the audio signal as an input, and a second comparator which compares an output of said high-pass filter with a second threshold; and
is configured to output a pulse detection signal that rises when an output of said high-pass filter exceeds the second threshold, and falls when the output of said high-pass filter is equal to or lower than the second threshold, and
said pulse judging unit includes a rise and fall detecting unit configured to detect the rise and the fall of the pulse detection signal outputted by said pulse detecting unit, and to measure an interval of the pulse noise detected in the audio signal.

4. The noise suppressing device according to claim 3, wherein said pulse judging unit is configured to judge that the detection result is valid, in the case where the amplitude of the composite signal within the interval measured by said rise and fall detecting unit exceeds the first threshold a predetermined number of times or more.

5. The noise suppressing device according to claim 3, wherein said pulse judging unit is configured to judge that the detection result is valid, only in the case where a length of the interval measured by said rise and fall detecting unit is equal to or less than a third threshold.

6. The noise suppressing device according to claim 2, further comprising a modulation rate detecting unit configured to detect a rate of modulation of the frequency-modulated signal, and to generate the first threshold according to the detected modulation rate,
wherein said first comparator compares the amplitude of the composite signal with the first threshold generated by said modulation rate detecting unit.

7. The noise suppressing device according to claim 1, further comprising:
a frequency transforming unit configured to transform the audio signal, in a time domain, of which pulse noise has been suppressed by said pulse suppressing unit, into a frequency spectrum in a frequency domain;
an electric field strength measuring unit configured to measure electric field strength of the audio signal that is received;
a noise pattern storage unit configured to store, for each of predetermined electric field strengths, a noise pattern represented by a frequency spectrum;
a spectrum subtracting unit configured to read, from said noise pattern storage unit, a noise pattern corresponding to the electric field strength measured by said electric field strength measuring unit, and to subtract the noise pattern from the frequency spectrum obtained by the frequency transforming unit; and
an inverse frequency transforming unit configured to inverse-frequency transform a frequency spectrum that is a result of the subtraction by said spectrum subtraction, from a frequency spectrum in a frequency domain into an audio signal in a time domain.

8. A noise suppressing method for suppressing pulse noise included in a frequency-modulated signal at low electric field strength, said noise suppressing method comprising:
band-limiting a composite signal to a band equal to or lower than a predetermined frequency so as to output an audio signal, the composite signal being obtained by demodulating an FM baseband signal;
detecting pulse noise in the audio signal outputted in said band-limiting;
judging, with the composite signal as an input, that a result of the detection in said detecting is valid in the case where pulse noise is included in the composite signal at a position corresponding to the pulse noise detected in the audio signal; and
suppressing the pulse noise detected in the audio signal, in the case where it is judged in said judging that the detection result of in said detecting is valid.

9. A non-transitory computer-readable recording medium having a computer program recorded thereon, said computer program being for a noise suppressing device which suppresses pulse noise included in a frequency-modulated signal at low electric field strength, and said computer program causing a computer to execute:
band-limiting a composite signal to a band equal to or lower than a predetermined frequency so as to output an audio signal, the composite signal being obtained by demodulating an FM baseband signal;
detecting pulse noise in the audio signal outputted in said band-limiting;
judging, with the composite signal as an input, that a result of the detection in said detecting is valid in the case where pulse noise is included in the composite signal at a position corresponding to the pulse noise detected in the audio signal; and
suppressing the pulse noise detected in the audio signal, in the case where it is judged in said judging that the detection result of in said detecting is valid.

10. An integrated circuit provided in a noise suppressing device which suppresses pulse noise included in a frequency-modulated signal at low electric field strength, said noise suppressing device comprising:
a band-limiting unit configured to band-limit a composite signal to a band equal to or lower than a predetermined frequency so as to output an audio signal, the composite signal being obtained by demodulating an FM baseband signal;
a pulse detecting unit configured to detect pulse noise in the audio signal outputted by said band-limiting unit;
a pulse judging unit having the composite signal as an input, and configured to judge that a result of the detection by said pulse detecting unit is valid in the case where pulse noise is included in the composite signal at a position corresponding to the pulse noise detected in the audio signal; and
a pulse suppressing unit configured to suppress the pulse noise detected in the audio signal, in the case where said pulse judging unit judges that the detection result of said pulse detecting unit is valid.

* * * * *